(12) United States Patent
Tang et al.

(10) Patent No.: US 12,327,736 B2
(45) Date of Patent: Jun. 10, 2025

(54) MULTILAYER PACKAGE SUBSTRATE WITH IMPROVED CURRENT DENSITY DISTRIBUTION

(71) Applicant: Texas Instruments Incorporated, Dallas, TX (US)

(72) Inventors: Yiqi Tang, Allen, TX (US); Rajen Murugan, Dallas, TX (US); Phuong Minh Vu, Atlanta, GA (US); Sylvester Ankamah-Kusi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 297 days.

(21) Appl. No.: 17/733,998

(22) Filed: Apr. 30, 2022

(65) Prior Publication Data
US 2023/0352314 A1 Nov. 2, 2023

(51) Int. Cl.
| | |
|---|---|
| H01L 21/48 | (2006.01) |
| H01L 21/56 | (2006.01) |
| H01L 23/00 | (2006.01) |
| H01L 23/31 | (2006.01) |
| H01L 23/498 | (2006.01) |

(52) U.S. Cl.
CPC ............ *H01L 21/485* (2013.01); *H01L 21/56* (2013.01); *H01L 23/3121* (2013.01); *H01L 23/49838* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 10,090,274 B2 * | 10/2018 | Strittmatter | ....... H01L 23/49844 |
| 2023/0317581 A1 * | 10/2023 | Tang | ....... H01L 24/16 257/737 |

* cited by examiner

*Primary Examiner* — Long Pham
(74) *Attorney, Agent, or Firm* — Dawn Jos; Frank D. Cimino

(57) ABSTRACT

Described examples include a method having steps of laying out at least two conductors and modeling conductor current through the at least two conductors to determine a current density in the at least two conductors. The method also has steps of revising the at least two conductors as adjusted conductors to add conductive material to areas of the conductor where the modeling conductor current shows above average current density; fabricating the adjusted conductors; and mounting a die to the adjusted conductors.

13 Claims, 17 Drawing Sheets

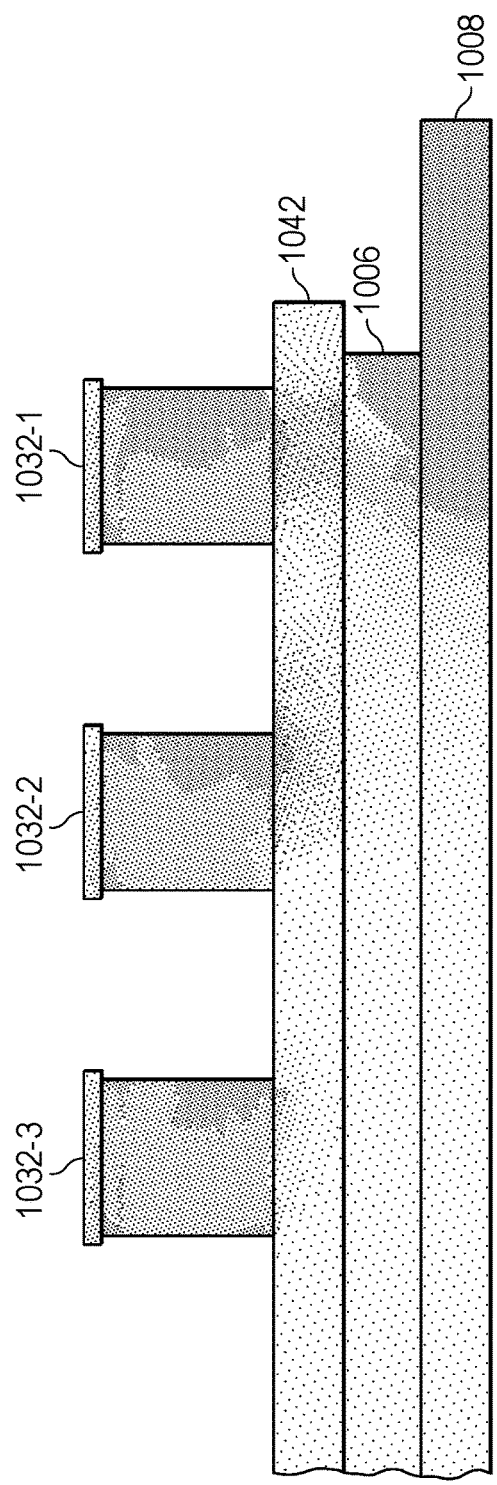
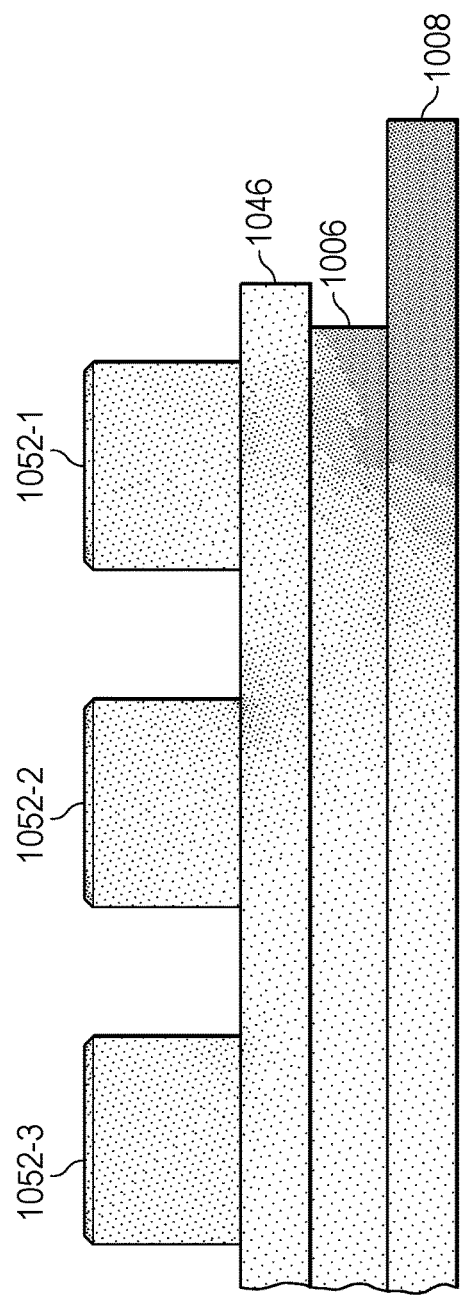
FIG. 10A
FIG. 10B

BEFORE

AFTER

MULTILAYER PACKAGE SUBSTRATE WITH IMPROVED CURRENT DENSITY DISTRIBUTION

TECHNICAL FIELD

This relates generally to electronic packaging, and more particularly to semiconductor packaging.

BACKGROUND

The semiconductor industry is developing integrated circuits with more and more power handling capability. This creates a challenge in getting the power into and out of the integrated circuit. Increased power means either greater current, greater voltages, or both. In some integrated circuit packages, conductive connection posts are formed on die connect pads of a die. A solder bump on the distal end of the conductive connection posts is mated with pads on a series of leads, sometimes in the form of a multilayer package substrate. The leads and the die are encapsulated to form a package that can be mounted to a printed circuit board, for example.

The electrical signals are provided to and from the integrated circuit via the leads, the solder bumps and the conductive connection posts. If too much current occurs in the leads, it can generate heat that can cause a failure of the solder bumps to provide an electrical connection or degrade the connection to where the integrated circuit fails. This issue is sometimes addressed with more leads and more conductive connection posts. However, this is not always feasible, adds cost, and can create more lead capacitance and/or inductance, which may degrade the operation of the integrated circuit. Thus, there is a need to create lead systems with increased current capacity that do not increase lead capacitance and/or inductance.

SUMMARY

In accordance with an example, a method includes laying out at least two conductors and modeling conductor current through the at least two conductors to determine a current density in the at least two conductors. The method also includes revising the at least two conductors as adjusted conductors to add conductive material to areas of the conductor where the modeling conductor current shows above average current density; fabricating the adjusted conductors; and mounting a die to the adjusted conductors.

In accordance with another example, a method includes laying out at least two conductors and laying out at least one conductive connection post between one of the at least two conductors and a die. The method also includes modeling conductor current through the at least two conductors and the at least one conductive connection post to determine a current density in the at least two conductors and the at least one conductive connection post. The method also includes revising the at least two conductors as adjusted conductors to add conductive material to areas of the conductor where the modeling conductor current shows above average current density and adjusting a size of the at least one conductive connection post as an adjusted conductive connection post if the current density in the at least one conductive connection post is greater than a selected threshold. The method also includes fabricating the adjusted conductive connection post on the die; fabricating the adjusted conductors; and mounting a die to the adjusted conductors using the adjusted conductive connection post.

In accordance with another example, an apparatus includes at least two adjusted conductors, a layout of the adjusted conductors determined by modeling conductor current through at least two conductors to determine a current density in the at least two conductors and revising the at least two conductors as adjusted conductors to add conductive material to areas of the conductor where the modeling conductor current shows above average current density. The apparatus also includes a die mounted to the adjusted conductors.

BRIEF DESCRIPTION OF THE DRAWINGS

FIGS. 10A and 10B (collectively "FIG. 10") are cross-sectional views of the leads of FIG. 9 showing a current density analysis.

DETAILED DESCRIPTION

Figure 1A:
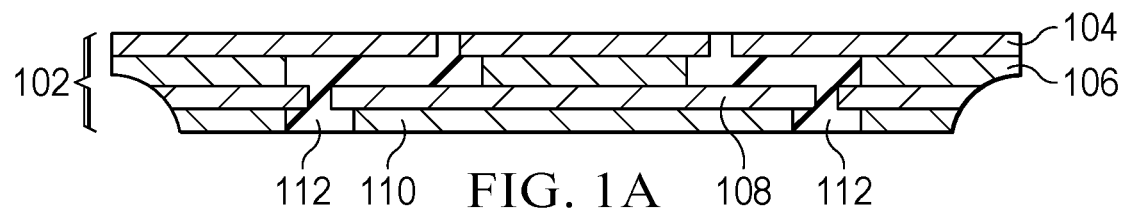
FIGS. 1A-1C (collectively "FIG. 1") are cross-sectional drawings of components of an apparatus that is an example integrated circuit package.

In the drawings, corresponding numerals and symbols generally refer to corresponding parts unless otherwise indicated. The drawings are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds, or thousands of transistors coupled to form a functional circuit, for example a microprocessor or memory device.

The term "microelectronic device package" is used herein. A microelectronic device package has at least one semiconductor die electrically coupled to terminals and has a package body that protects and covers the semiconductor die. The microelectronic device package can include additional elements, in some arrangements an integrated antenna is included. Passive components such as capacitors, resistors, and inductors or coils can be included. In some arrangements, multiple semiconductor dies can be packaged together. For example, a power metal oxide semiconductor (MOS) field effect transistor (FET) semiconductor die, and a logic semiconductor die (such as a gate driver die, or a controller die) can be packaged together to from a single packaged electronic device. The semiconductor die is mounted to a package substrate that provides conductive leads; a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die pad for each packaged device and die attach or die adhesive can be used to mount the semiconductor dies to the lead frame die pads. In wire bonded packages, bond wires can couple bond pads on the semiconductor dies to the leads of the lead frames. The lead frames may have plated portions in areas designated for wire bonding, for example silver plating can be used. After the bond wires are in place, a portion of the package substrate, the semiconductor die, and at least a portion of the die pad can be covered with a protective material such as a mold compound.

The term "multilevel package substrate" is used herein. A multilevel package substrate is a substrate that has multiple conductor levels including conductive traces, and which has vertical conductive connections extending through the dielectric material between the conductor levels. In an example arrangement, a routable lead frame (RLF) is formed by plating a patterned conductor level and then covering the conductor with a layer of dielectric material. Grinding can be performed on the dielectric material to expose portions of the layer of conductors. Additional plating layers can be formed to add additional levels of conductors, some of which are coupled to the prior layers by vertical connectors, and additional dielectric material can be deposited at each level and can cover the conductors. By using an additive or build up manufacturing approach, and by performing multiple plating steps, molding steps, and grinding steps, a multilayer package substrate is formed with an arbitrary number of layers. In an example arrangement, copper conductors are formed by plating, and a thermoplastic material can be used as the dielectric material.

In packaging microelectronic and semiconductor devices, mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" or "scribe line" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other, and the saw will traverse the molded electronic devices in two different directions to cut apart the packaged electronic devices from one another in the array.

The term quad flat no-lead (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Leaded packages can be used with the arrangements where the leads extend away from the package body and are shaped to form a portion for soldering to a board. A dual in-line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

Figure 1B:
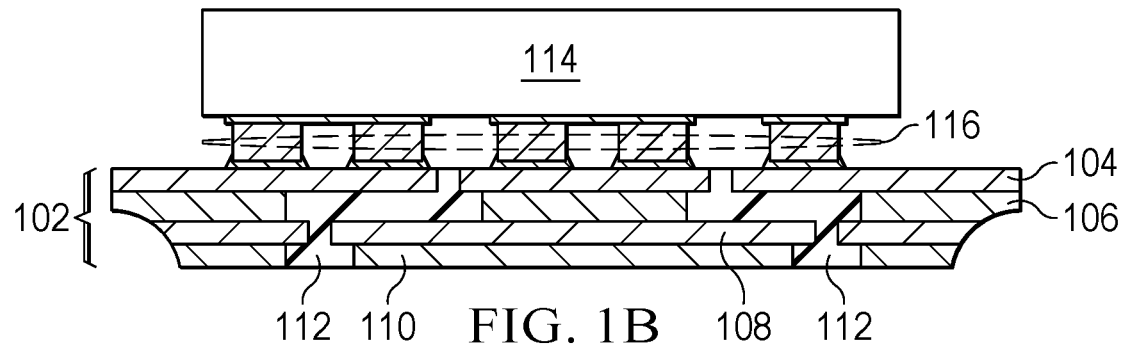
Figure 1C:
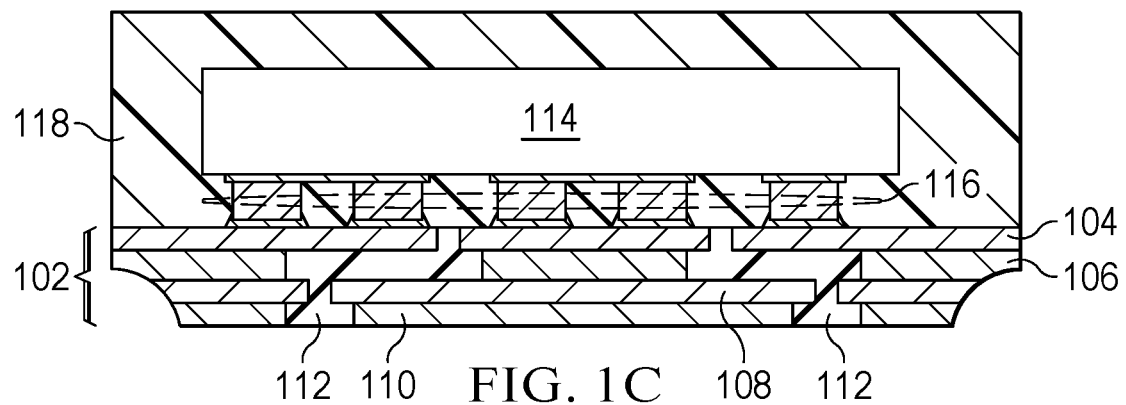
Figure 2A:
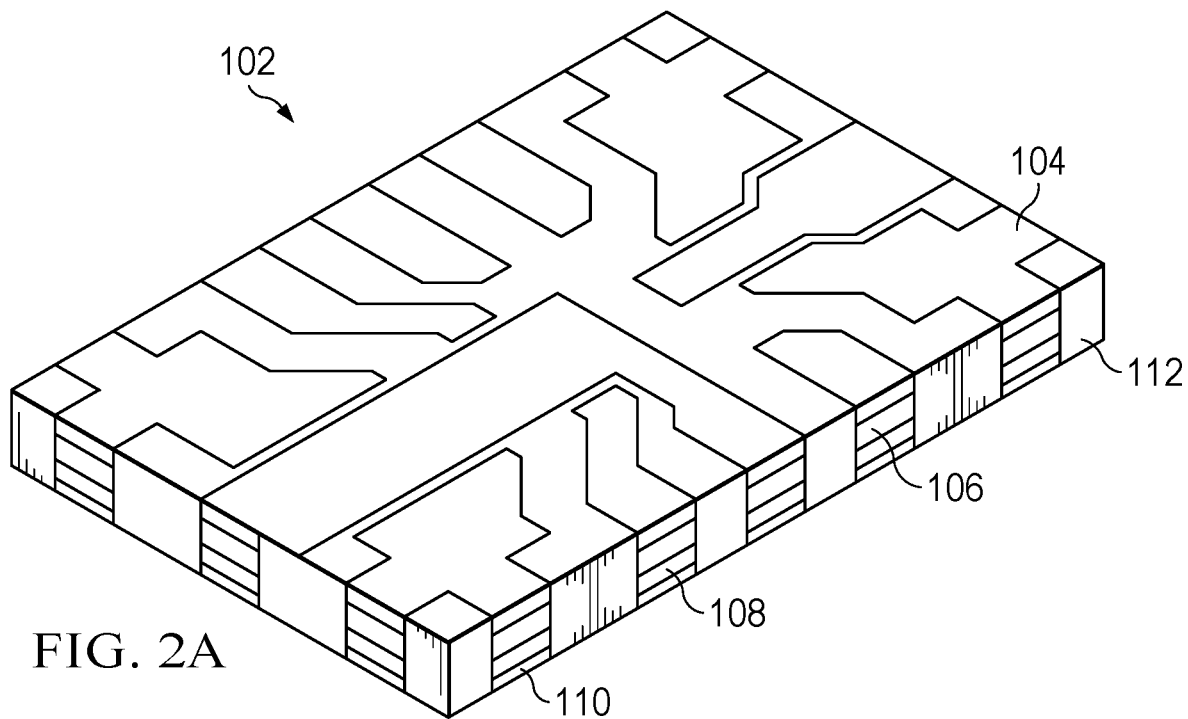
FIGS. 2A-2C (collectively "FIG. 2") are perspective views of the components of the apparatus of FIG. 1.
Figure 2B:
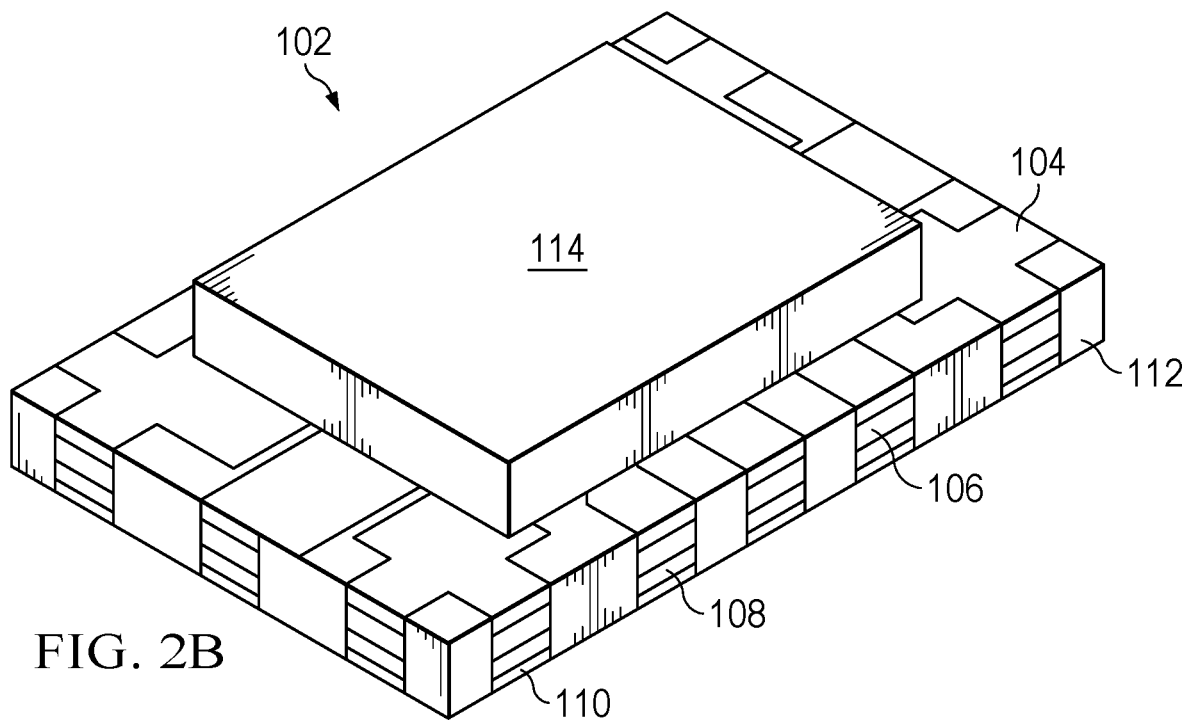
Figure 2C:
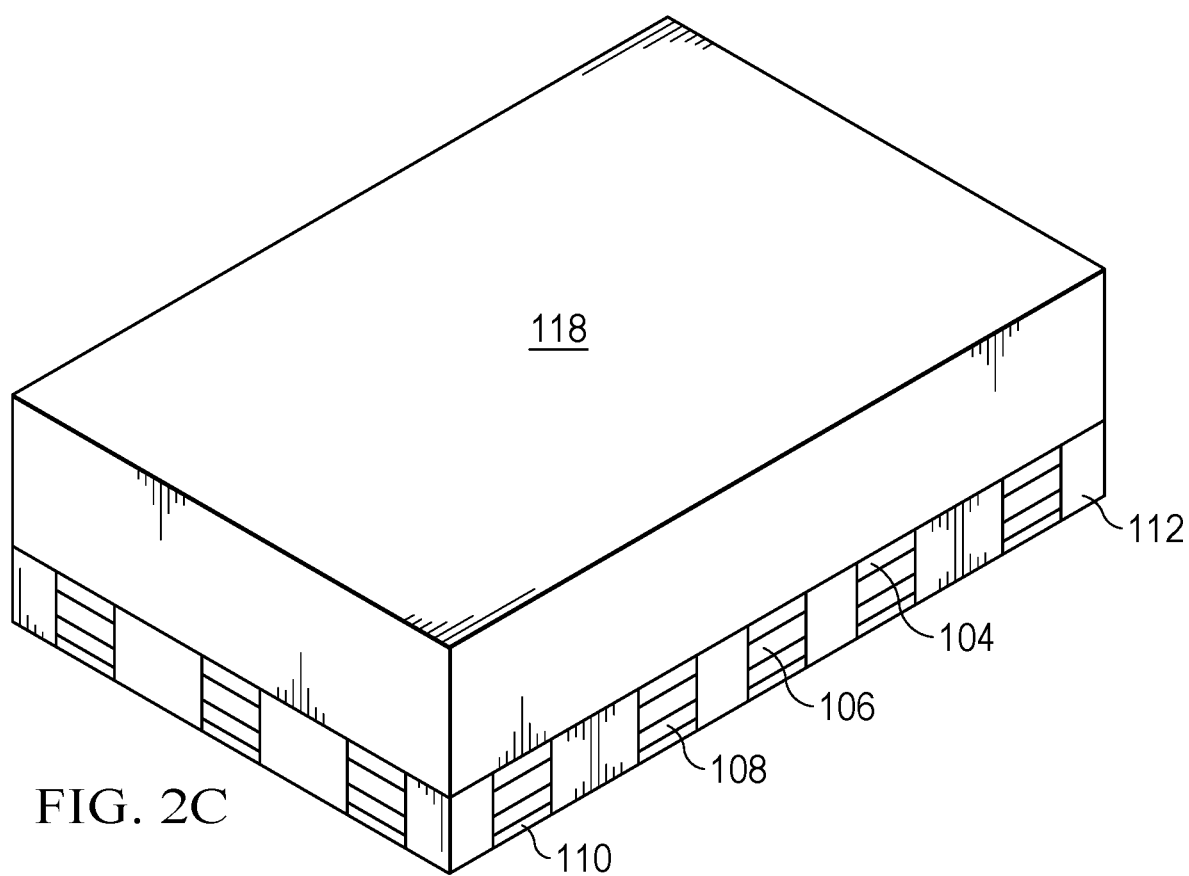

FIGS. 1A-1C (collectively "FIG. 1") are cross-sectional drawings of components of an apparatus that is an example integrated circuit package. FIGS. 2A-2C (collectively "FIG. 2") are perspective diagrams of the components illustrated in FIG. 1. Multilayer package substrate 102 includes four layers: first layer 104, second layer 106, third layer 108, and fourth layer 110. Each of these layers can have a patterned conductive layer comprising copper, silver, titanium, gold, or other conductive materials, including alloys of these conductive materials. The portion of each layer that does not include conductive material is dielectric material such as dielectric 112. The dielectric material of the multilayer package substrate 102 can be a thermoplastic or a thermoset material. An example thermoplastic material is ABS (Acrylonitrile Butadiene Styrene). Alternative dielectric materials include thermoplastics such as ASA (Acrylonitrile Styrene Acrylate), thermoset mold compound including epoxy resin, epoxies, resins, or plastics. A perspective view of multilayer package substrate 102 is shown in FIG. 2A.

FIG. 1B shows an example die 114 mounted on multilayer package substrate 102. Die 114 includes conductive connection posts 116. Conductive connection posts 116 are formed on bond pads (not shown in this figure) on the surface of die 114. A solder bump (not shown in this figure) is formed on top of each of the conductive connection posts. The die is then flipped over so that the solder bump contacts pads in first layer 104. Compression, heat, or vibration is used to form a conductive connection from first layer 104 to conductive connection posts 116 via the solder bumps. A perspective view of die 114 mounted on multilayer package substrate 102 is shown in FIG. 2B.

FIG. 1C is a cross-sectional view of die 114 mounted on multilayer package substrate 102 and encapsulated by encapsulant 118. Mold compound is an example encapsulant. The completed package shown in the example of FIG. 1C and FIG. 2C is a quad flat no-lead (QFN) package. QFN packages are one type of package that is useful with the arrangements. Other package types including leaded and other no lead packages can be used.

In the arrangements, a semiconductor device is mounted to a device side surface of a multilayer package substrate. In forming the arrangements, the semiconductor devices can be formed independently of the multilayer package substrate, so that methods for forming the semiconductor device, and the multilayer package substrate, can be performed at different times, and at different locations, then the components can be assembled together to complete the arrangements.

Figure 3A:
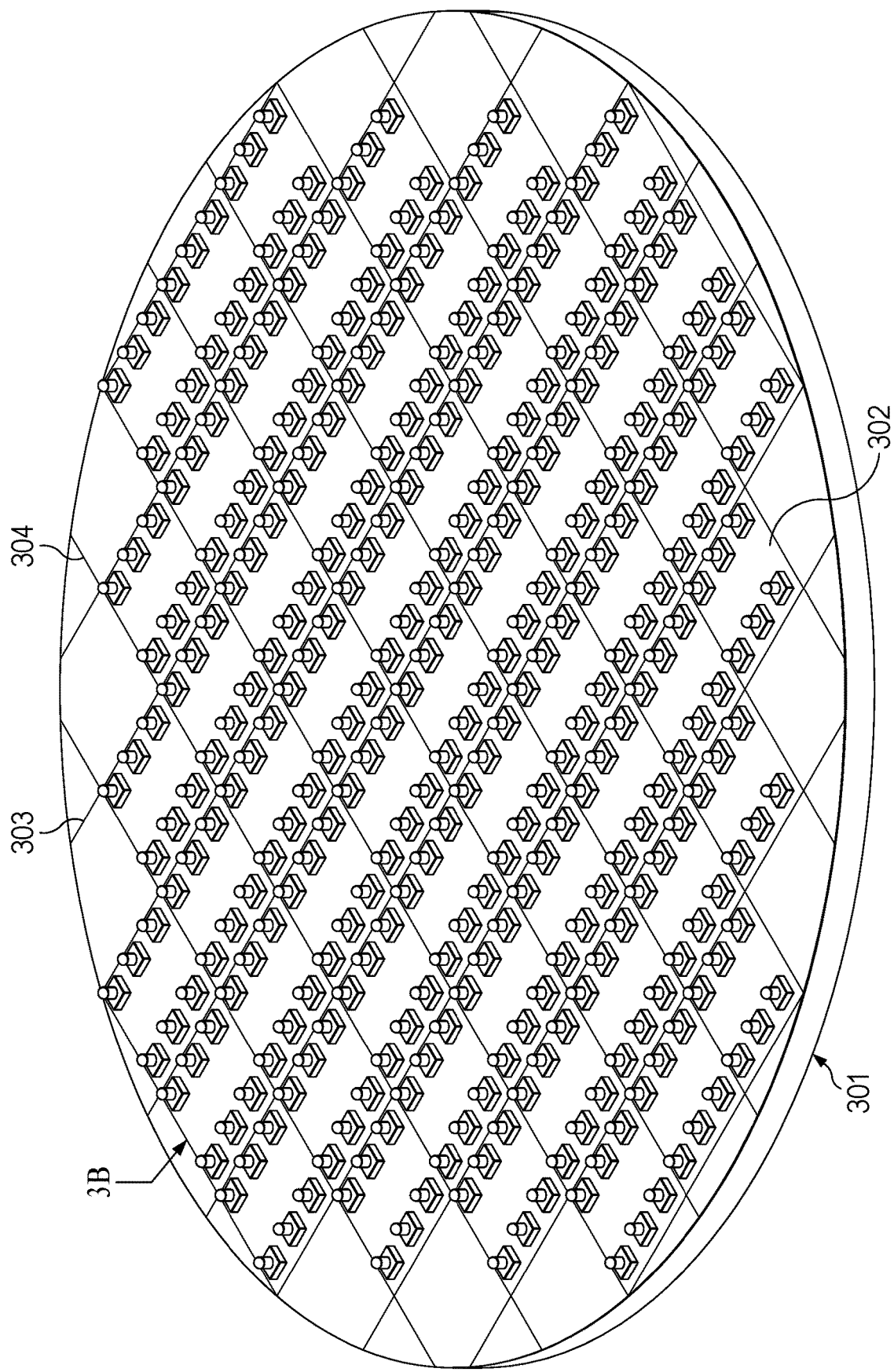
FIGS. 3A and 3B (collectively "FIG. 3") illustrate in two projection views a semiconductor wafer having semiconductor devices formed on it and configured for flip chip mounting, and an individual semiconductor die for flip chip mounting, respectively.
Figure 3B:
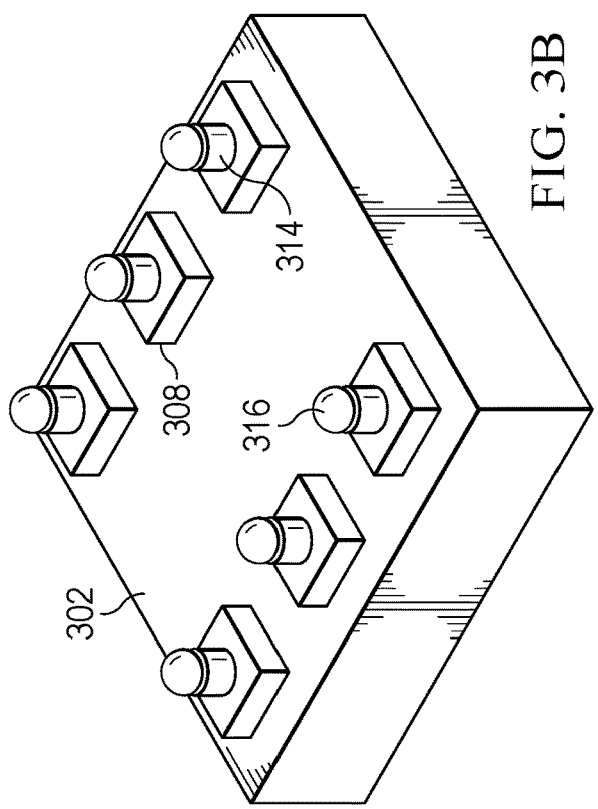

FIGS. 3A and 3B (collectively "FIG. 3") illustrate in two projection views a semiconductor wafer having semiconductor devices formed on it and configured for flip chip mounting, and an individual semiconductor die for flip chip mounting, respectively. In FIG. 3A, a semiconductor wafer 301 is shown with an array of semiconductor dies 302 formed in rows and columns on a surface. The semiconductor dies 302 can be formed using processes in a semiconductor manufacturing facility, including ion implantation, doping, anneals, oxidation, dielectric and metal deposition, photolithography, pattern, etch, chemical mechanical polishing (CMP), electroplating, and other processes for making semiconductor devices. Scribe lanes 303 and 304, which are perpendicular to one another, and which run in parallel groups across the semiconductor wafer 301, separate the rows and columns of the completed semiconductor dies 302, and provide areas for dicing the wafer to separate the semiconductor dies 302 from one another.

FIG. 3B illustrates a single semiconductor die 302, with bond pads 308, which are conductive pads that are electrically coupled to devices (not shown) formed in the semiconductor die 302. Conductive connection posts 314 are shown extending away from a proximate end mounted on the bond pads 308 on the surface of semiconductor die 302 to a distal end, and solder bumps 316 are formed on the distal ends of the conductive connection posts 314. The conductive connection posts 314 can be formed by electroless plating or electroplating. In an example, the conductive connection posts 314 are copper pillar bumps. Copper pillar bumps can be formed by sputtering a seed layer over the surface of the semiconductor wafer 301, forming a photoresist layer over the seed layer, using photolithography to expose the bond pads 308 in openings in the layer of photoresist, plating the copper conductive connection posts 314 on the bond pads, and plating a lead solder or a lead-free solder such as an tin, silver (SnAg) or tin, silver, copper (SnAgCu) or SAC solder to form solder bumps 316 on the copper conductive connection posts 314. In alternative approach, solder bumps or particles may be dropped onto the distal ends of the copper pillar bumps and then reflowed in a thermal process to form bumps. Other conductive materials can be used for the conductive connection posts in an electroplating or electroless plating operation, including gold, silver, nickel, palladium, or tin, for example. Not shown for clarity of illustration are under bump metallization (UBM) portions which can be formed over the bond pads to improve plating and adhesion between the conductive connection posts 314 and the bond pads 308. After the plating operations, the photoresist is then stripped, and the excess seed layer is etched from the surface of the wafer. The semiconductor dies 302 are then separated by dicing, or are singulated, using the scribe lanes 303, 304 (see FIG. 3A).

Figure 4:
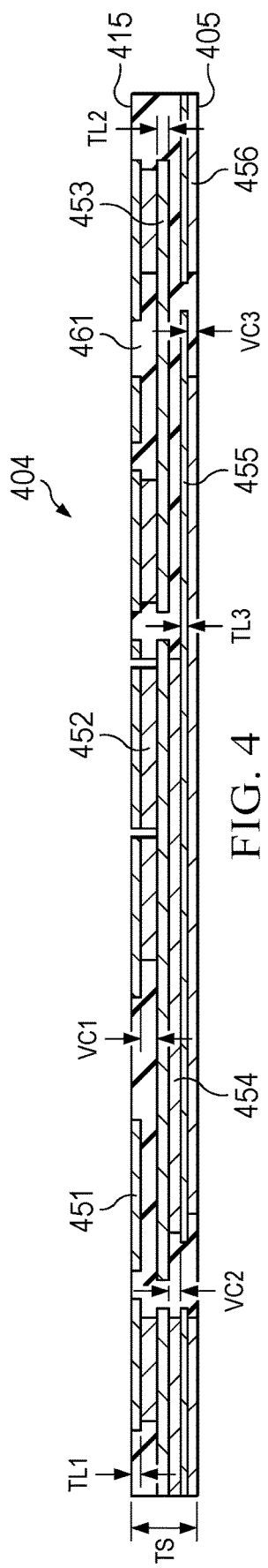
FIG. 4 illustrates in a cross-sectional view a multilayer package substrate that can be used with the described arrangements.

FIG. 4 illustrates in a cross-sectional view a multilayer package substrate 404 that can be used with the arrangements. In FIG. 4, the multilayer package substrate 404 has a device side surface 415 and a board side surface 405. Three trace layers 451, 453, 455 are formed spaced from one another by dielectric material, the trace layers are patterned for making horizontal connections, and three vertical connection layers 452, 454, 456 form electrical connections between the three trace layers 451, 453, 455 and extend through the dielectric material 461 that is disposed over and between the trace layers. The dielectric material 461 can be a thermoplastic material such as ABS, or ASA, or can be a thermoset material, such as epoxy resin mold compound.

In one example the multilayer package substrate 404 has a substrate thickness labeled TS of 200 µm. The first trace layer, 451, near the device side surface 415 of the multilayer package substrate, has a trace layer thickness TL1 of 15 µm. The first vertical conductor layer, 452, has a thickness VC1 of 25 µm. The second trace layer, 453, sometimes coupled to the first trace layer by the first trace layer 451, has a thickness labeled TL2 of 60 µm. The second vertical connection layer, 454, has a thickness labeled VC2 of 65 µm. The third trace layer, 455, has a thickness labeled TL3 of 15 µm, and the third vertical connection layer, 456, has a thickness labeled VC3 of 25 µm. Additional layers, such as conductive lands on the device side surface 415, or terminals on the board side surface 405, may be formed by plating (not shown in FIG. 4). A continuous vertical connection between the device side surface 415 and the board side surface 405 can be formed by patterning a stack of trace layers and the corresponding vertical connection layers to form a continuous conductive path extending through the dielectric material 461. Note that in this description, the vertical connection layers 452, 454, and 456 are not described as "vias" to distinguish the vertical connections of the arrangements from the vertical connections of PCBs or other substrates, which are filled via holes. The vertical connections of the arrangements are formed using additive manufacturing, while vias in PCBs are usually formed by removing material, for example via holes are drilled into the substrate. These via holes between conductor layers then must be plated and filled with a conductor, which requires additional plating steps after the drilling steps. These additional steps are precise manufacturing processes that add costs and require additional manufacturing tools and capabilities. In contrast the vertical connection layers used in the multilayer package substrates of the arrangements are formed in the same plating processes as forming the trace layers, simplifying manufacture, and reducing costs. In addition, the vertical connection layers in the arrangements can be arbitrary shapes, such as rails, columns, or posts, and the rails can be formed in continuous patterns to form electric shields, tubs, or tanks, and can be coupled to grounds or other potentials, isolating regions of the multilayer package substrate from one another. Noise reduction and the ability to create electrically isolated portions of the multilayer package substrate can be enhanced by use of the vertical connections to form tanks, shields, and tubs. Thermal performance of the microelectronic device packages of example arrangements can be improved by use of the vertical connection layers to form thermally conductive columns, sinks or rails that can be coupled to thermal paths on a system board to increase thermal dissipation from the semiconductor devices mounted on the multilayer package substrate.

Figure 5A:
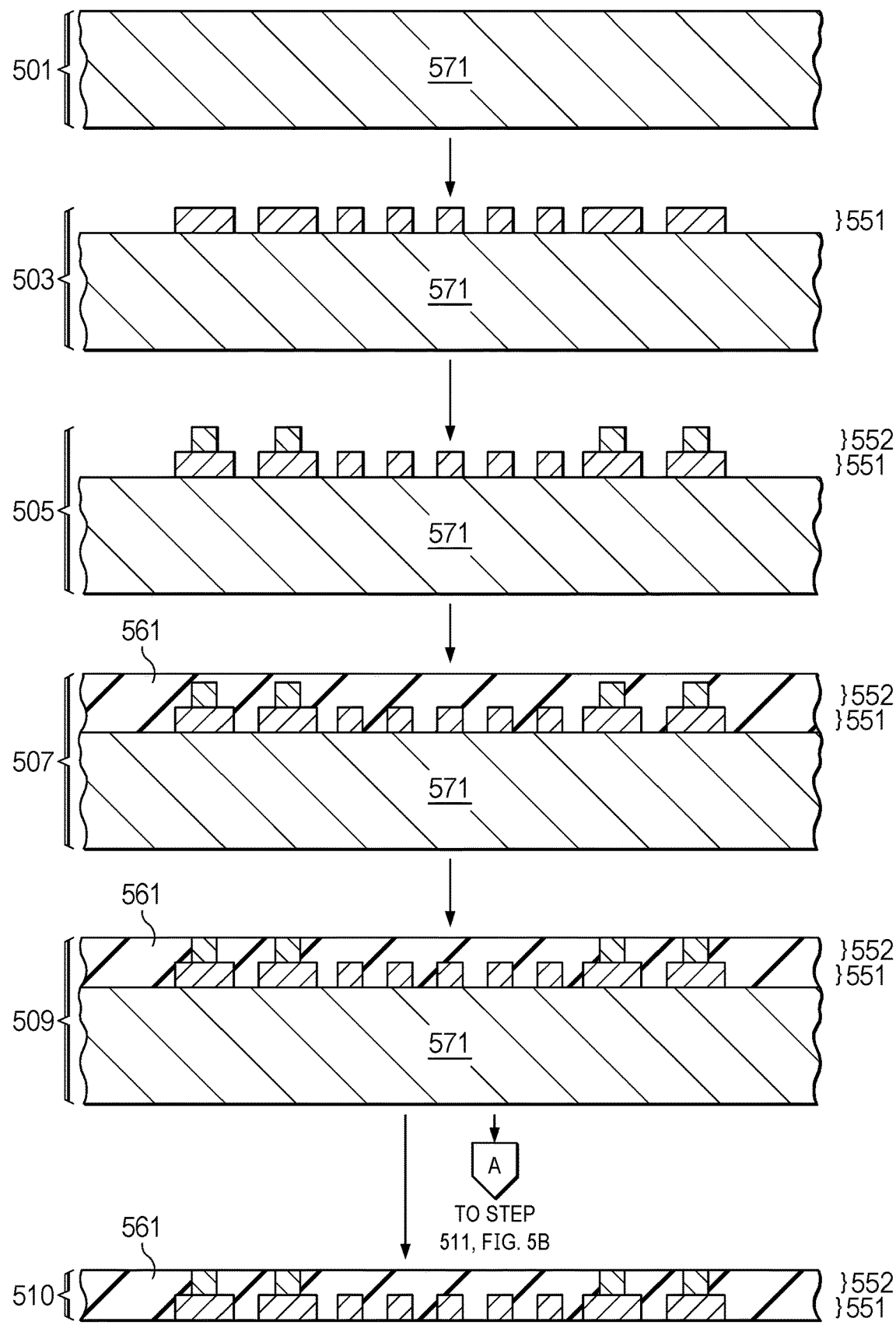
FIGS. 5A-5B (collectively "FIG. 5") illustrate, in a series of cross-sectional views, selected steps for a method for forming a multilayer package substrate that is useful with the arrangements.
Figure 5B:
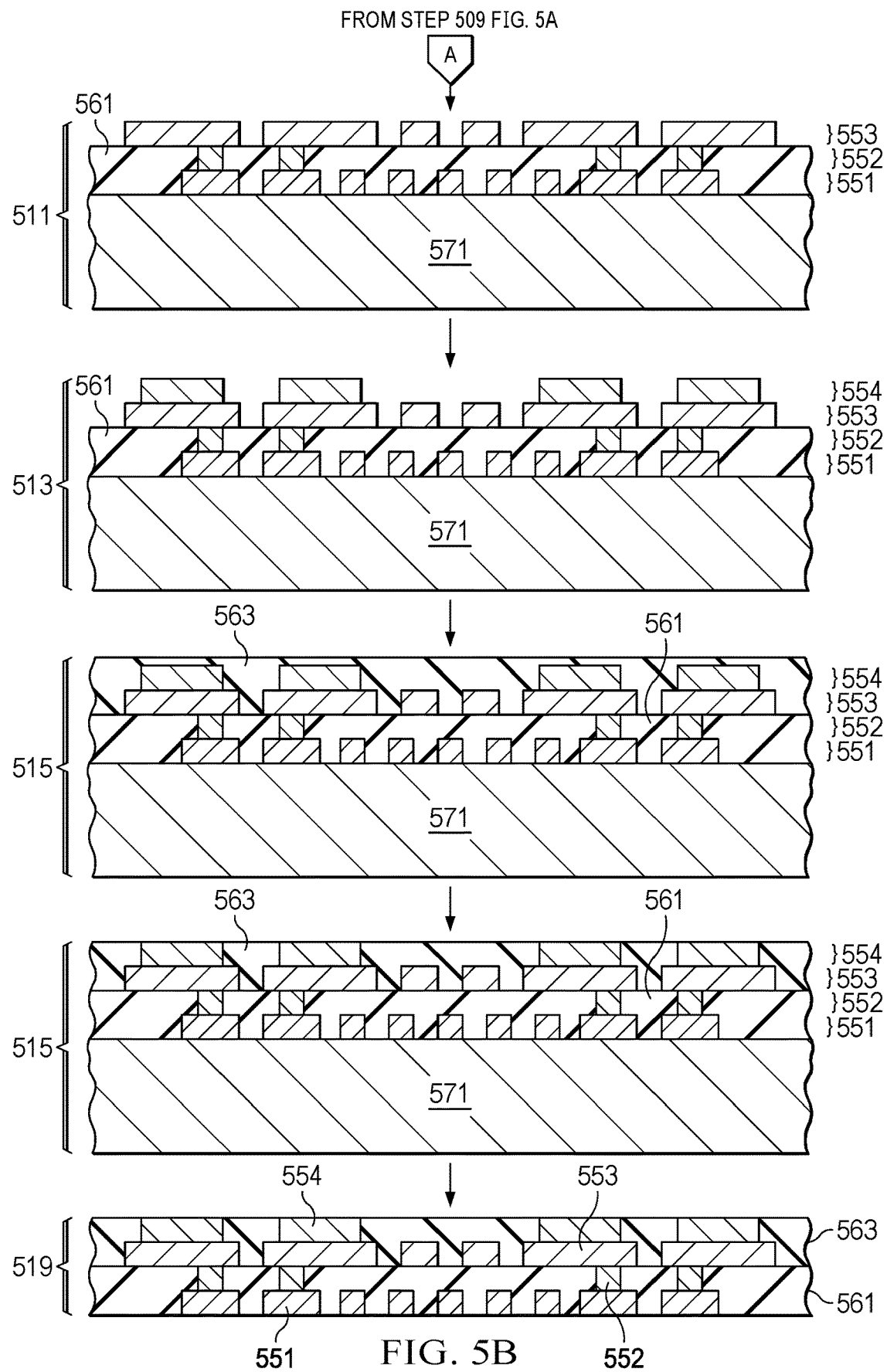

FIGS. 5A-5B (collectively "FIG. 5") illustrate, in a series of cross-sectional views, selected steps for a method for forming a multilayer package substrate that is useful with the arrangements. In FIG. 5A, at step 501, a metal carrier 571 is readied for a plating process. The metal carrier 571 can be stainless steel, steel, aluminum or another metal that will support the multilayer package substrate layers during plating and molding steps, the multilayer package substrate is then removed, and the metal carrier is cleaned for additional manufacturing processes.

At step 503, a first trace layer 551 is formed by plating. In an example process, a seed layer is deposited over the surface of the metal carrier 571, by sputtering, chemical vapor deposition (CVD) or other deposition step. A photoresist layer is deposited over the seed layer, exposed, developed, and cured to form a pattern to be plated. Electroless or electroplating is performed using the exposed portions of the seed layer to start the plating, forming a pattern according to patterns in the photoresist layer.

At step 505, then plating process continues. A second photoresist layer is deposited, exposed, and developed to pattern the first vertical connection layer 552. By leaving the first photoresist layer in place, the second photoresist layer is used without an intervening strip and clean step, to simplify processing. The first trace layer 551 can be used as a seed layer for the second plating operation, to further simplify processing.

At step 507, a first molding operation is performed. The first trace layer 551 and the first vertical connection layer 552 are covered in a dielectric material. In an example a thermoplastic material is used, in a particular example ABS is used; in alternative examples ASA can be used, or a thermoset epoxy resin mold compound can be used, or resins, epoxies, or plastics can be used. In an example compressive molding operation, a mold compound can be heated to a liquid state, forced under pressure through runners into a mold to cover the first trace layer 551 and the first vertical connection layer 552, and subsequently cured to form solid mold compound 561.

At step 509, a grinding operation performed on the surface of the mold compound 561 exposes a surface of the first vertical connection layer 552 and provides conductive surfaces for mounting devices, or for use in additional plating operations. If the multilayer package substrate is complete, the method ends at step 510, where a de-carrier operation removes the metal carrier 571 from the mold compound 561, leaving the first trace layer 551 and the first vertical connection layer 552 in a mold compound 561, providing a package substrate.

In examples where additional trace layers and additional vertical connection layers are needed, the method continues, leaving step 509 and transitioning to step 511 in FIG. 5B.

At step 511, a second trace layer 553 is formed by plating using the same processes as described above with respect to step 505. A seed layer for the plating operation is deposited and a photoresist layer is deposited and patterned, and the plating operation forms the second trace layer 553 over the mold compound 561, with portions of the second trace layer 553 electrically connected to the first vertical connection layer 552.

At step 513, a second vertical connection layer 554 is formed using an additional plating step on the second trace layer 553. The second vertical connection layer 554 can be plated using the second trace layer 553 as a seed layer, and without the need for removing the preceding photoresist layer, simplifying the process.

At step 515, a second molding operation is performed to cover the second trace layer 553 and the second vertical connection layer 554 in a layer of mold compound 563. The multilayer package substrate at this stage has a first trace layer 551, a first vertical connection layer 552, a second trace layer 553, and a second vertical connection layer 554, portions of the layers are electrically connected together to form vertical paths through the layers of mold compound 561 and 563.

At step 517, the mold compound 563 is mechanically ground in a grinding process or chemically etched to expose a surface of the second vertical connection layer 554. At step 519 the example method ends by removing the metal carrier 571, leaving a multilayer package substrate including the trace layers 551, 552, 553 and 554 in mold compound 561, 563. The steps of FIGS. 5A-5B can be repeated to form multilayer package substrates for use with the arrangements having more layers, by performing plating of a trace layer, plating of a vertical connection layer, molding, and grinding, repeatedly.

Figure 6:
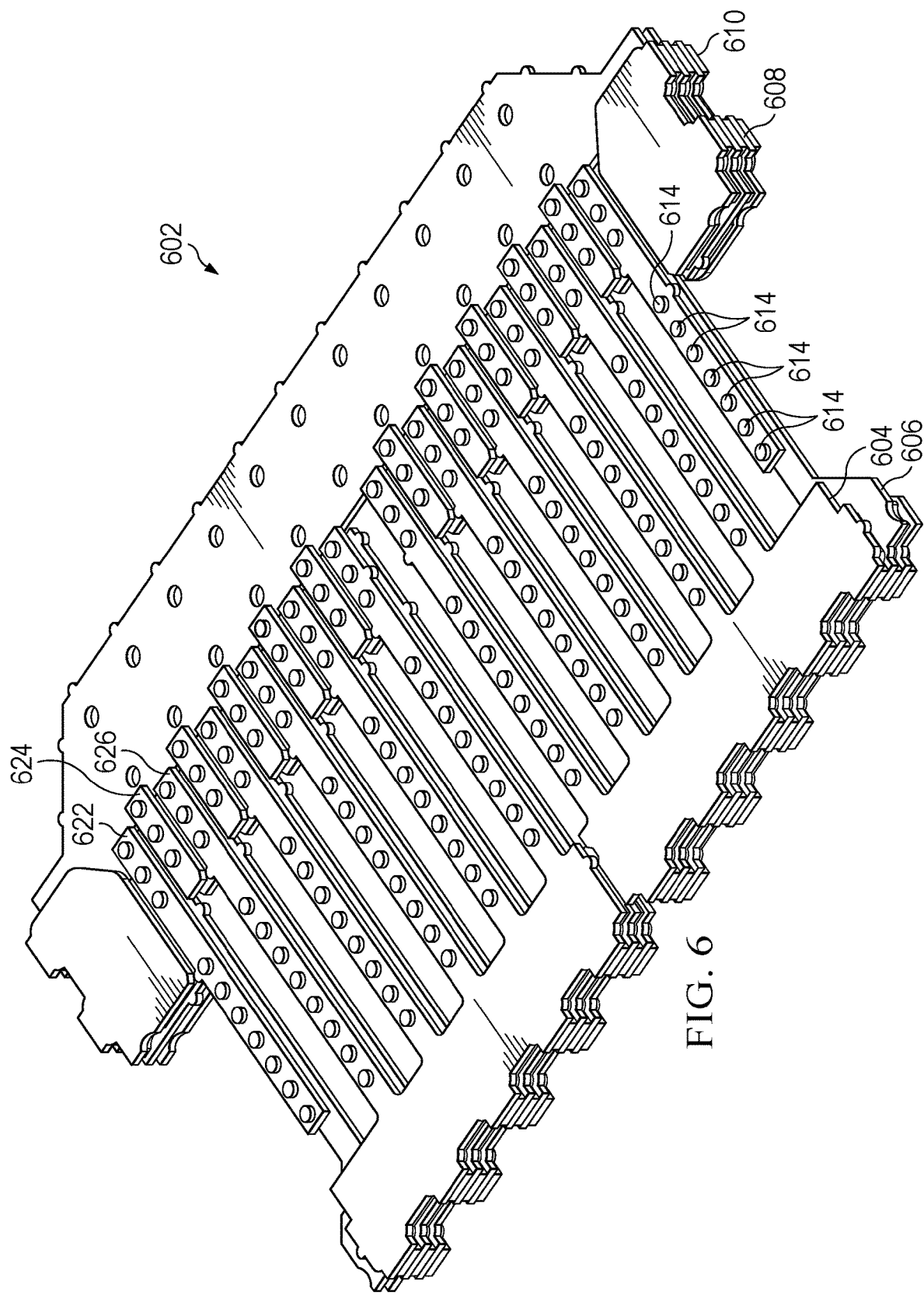
FIG. 6 is a perspective view of an example multilayer package substrate.

FIG. 6 is a perspective view of an example multilayer package substrate 602. Dielectric portions of multilayer package substrate 602 are omitted for clarity of the figure. First conductor layer 604 is the device-side layer of multilayer package substrate 602. First conductor layer 604 includes connection points 614 where conductive connection posts are to be in contact with first conductor layer 604. Only a few of connection points 614 are labeled for clarity of the drawing, but each of the dots in FIG. 6 is one of connection points 614. First conductor layer 604 also includes leads 622, 624, and 626, which are three of many leads in first conductor layer 604. Second conductor layer 606, third conductor layer 608 and fourth conductor layer 610 are also shown in FIG. 6.

Figure 7A:
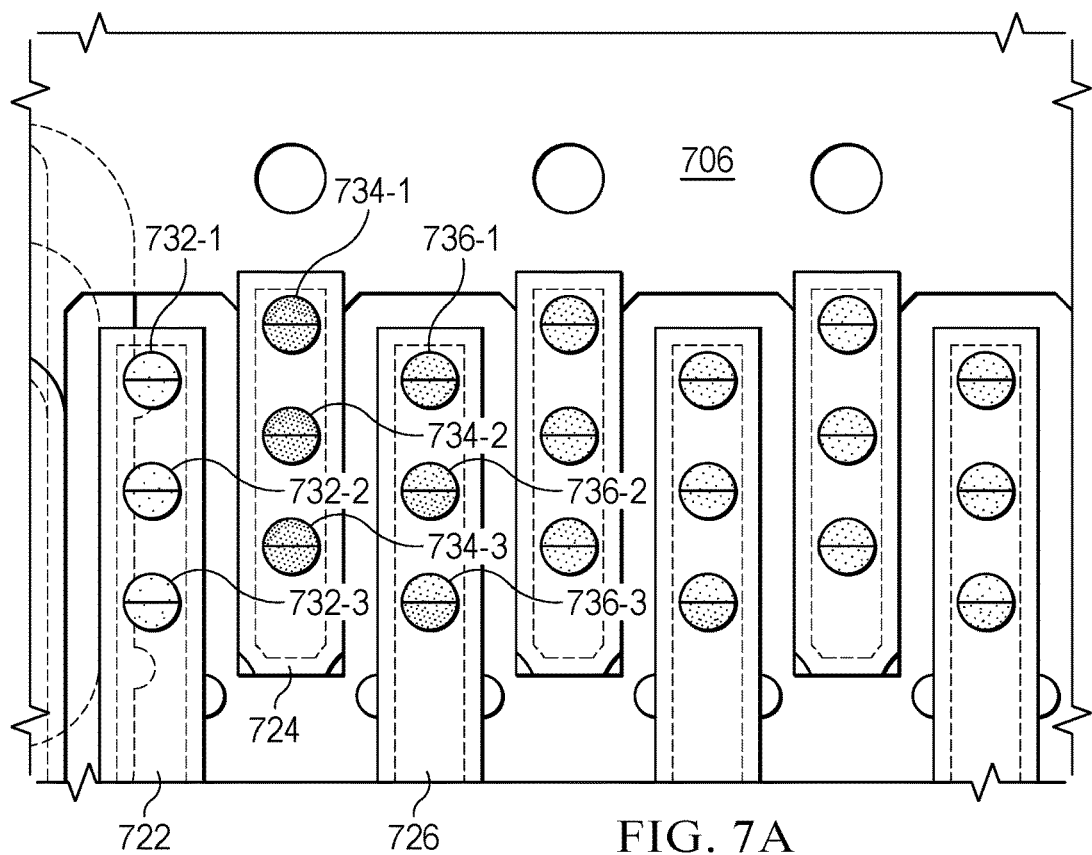
FIGS. 7A-7C (collectively "FIG. 7") are plan view diagrams of a portion of a first conductor layer.
Figure 7C:
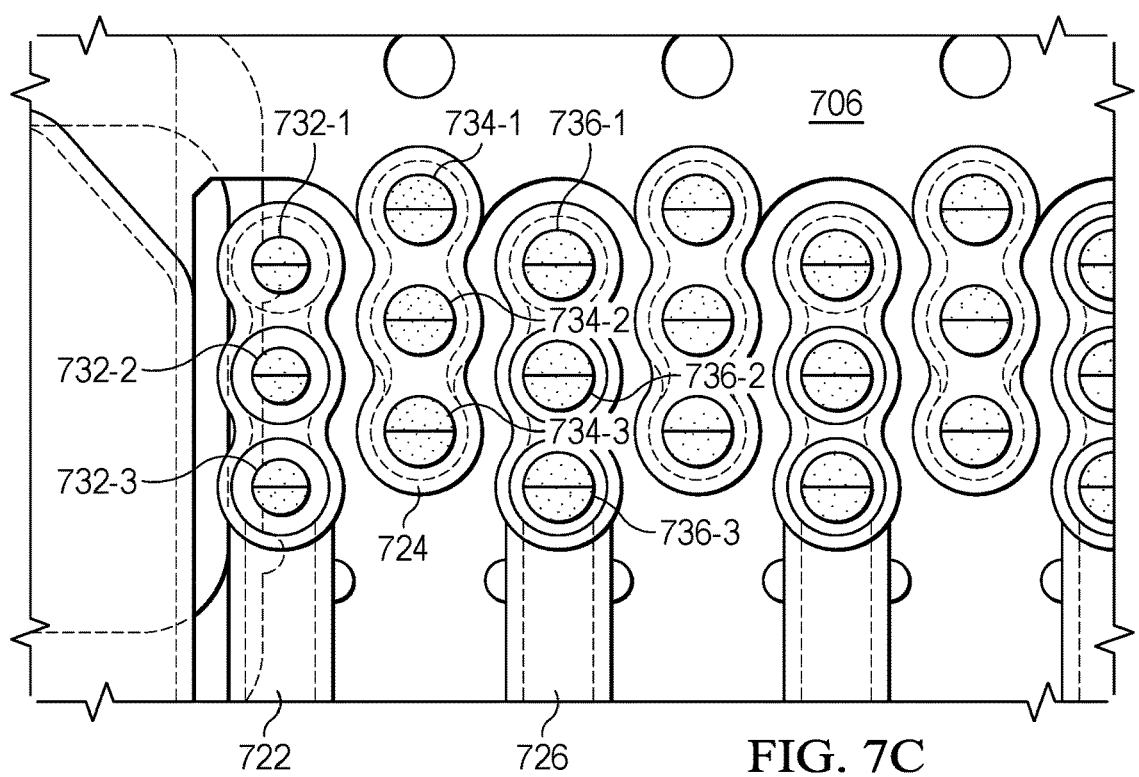
Figure 7B:
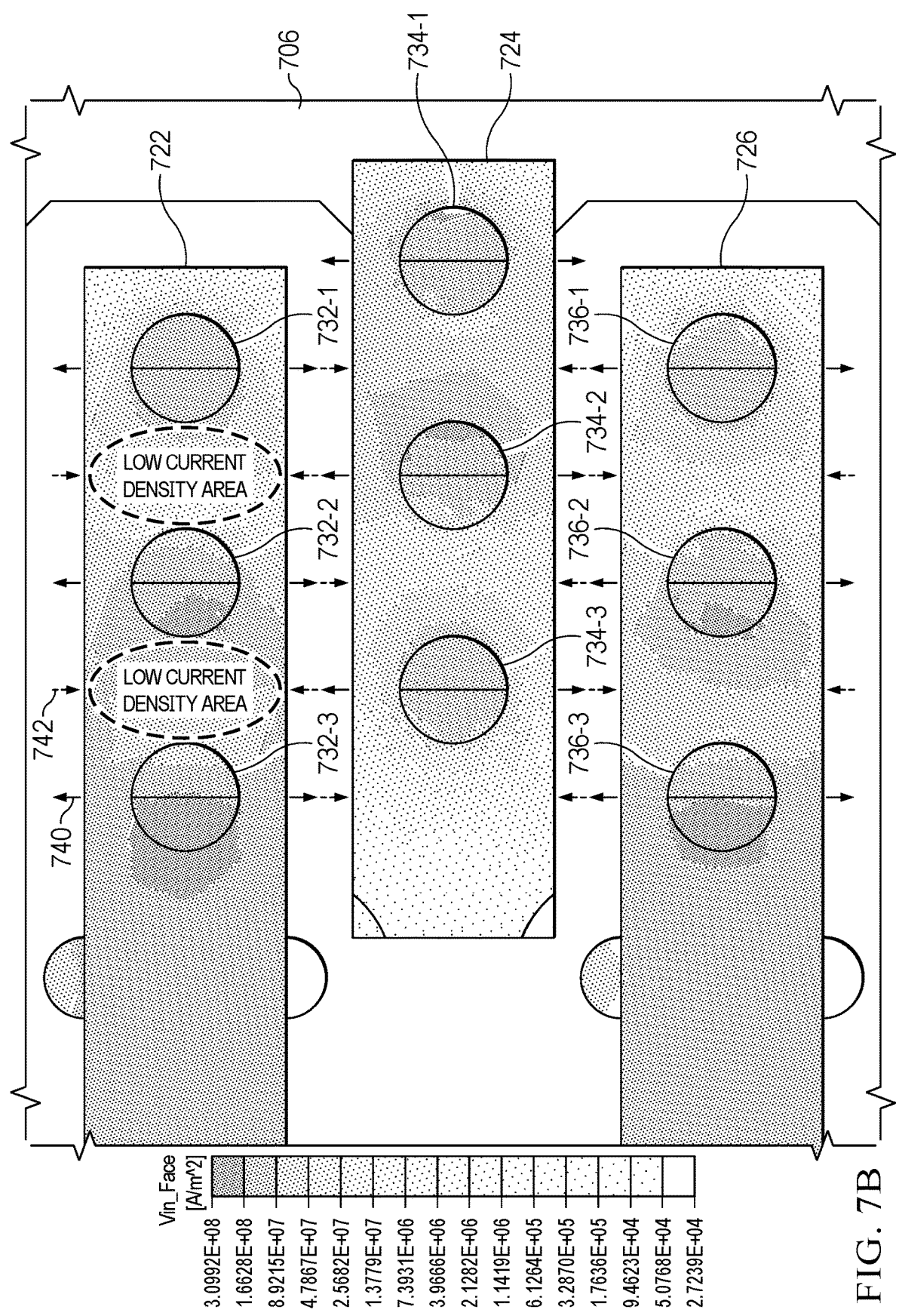

FIGS. 7A-7C (collectively "FIG. 7") are plan view diagrams of a portion of first conductor layer 604 (FIG. 6). FIG. 7A is a plan view of a portion of first conductor layer 604 (FIG. 6) before optimization. The optimization process is discussed in more detail hereinbelow. Adjusted lead 722 is an example of an adjusted conductor and includes first attachment point 732-1, second attachment point 732-2, and third attachment point 732-3. Each of these attachment points is where a solder ball (not shown) coupled to a conductive connection post (not shown) is coupled to the lead. Multiple attachment points on one lead are often used for high power circuits. These attachment points may be provided for different circuits within the integrated circuit. However, they are often used in high power circuits to provide high current carrying capability. This type of structure may be to provide power to the integrated circuit or to carry the output of a high output circuit. Adjusted lead 724 is another example of an adjusted conductor and includes first attachment point 734-1, second attachment point 734-2, and third attachment point 734-3. Each of these attachment points are also where a solder ball (not shown) coupled to a conductive connection post (not shown) is coupled to the lead. Adjusted lead 726 is another example of an adjusted conductor and includes first attachment point 736-1, second attachment point 736-2, and third attachment point 736-3. As with the other leads, each of these attachment points is where a solder ball (not shown) coupled to a conductive connection post (not shown) is coupled to the lead. These three leads are chosen as examples. With a typical flip-chip package configuration, a lead frame may include hundreds of attachment points. Second conductor layer 706 is shown for orientation with FIG. 6.

FIG. 7B is a current density diagram of the portion of first level lead 704 shown in FIG. 7A. Lighter shading shows higher current density and darker shading shows lower current density. This current density is determined by computer modeling conductor current density of adjusted leads 722, 724, and 726, the solder balls at each of the attachment points with their associated conductive connection posts. As an example, area 740 shows an area with a higher-than-average current density. Area 742 shows an area with a lower-than-average current density. Each of the sets of arrows in FIG. 7B pointing away from the associated lead is an area of higher-than-average current density. Each of the sets of arrows pointing toward the associated lead is an area of lower-than-average current density. The higher current density areas tend to be exacerbated in multilayer package substrates because the conductive layers are often thinner than other types of leads to allow for multiple layers of leads.

FIG. 7C shows adjusted leads 722, 724, and 726 with adjustments according to the current density modeling described with regard to FIG. 7B. As can be seen in FIG. 7C, where adjusted leads 722, 724, and 726 are wider at higher current density points and narrower at lower current density points. As explained further with regard to FIG. 10, this lowers the overall current density of the leads without requiring more space, which in essence lowers the resistance of the leads. In addition, aligning high density regions in one lead with low density regions in adjacent leads allows for greater spacing between the leads, thus maintaining or possibly reducing the capacitance and inductance between leads.

Figure 8:
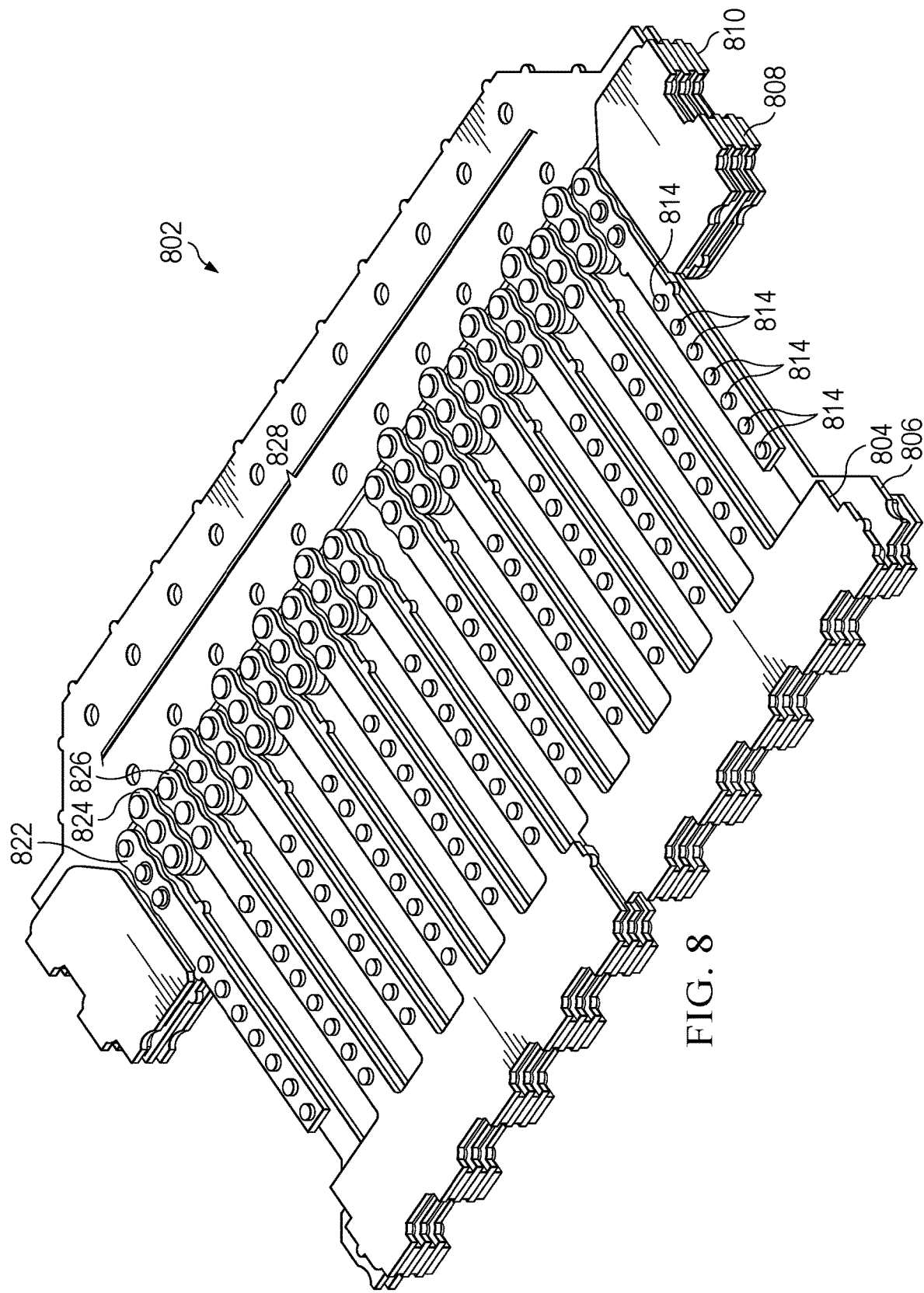
FIG. 8 is a perspective view of an example multilayer package substrate.

FIG. 8 is a perspective view of an example multilayer package substrate 802 that is an example of multilayer package substrate 602 (FIG. 6) with adjusted leads 822, 824, and 826 adjusted as described above with regard to FIG. 7C. In addition, all of the leads 828 have also been adjusted. As with multilayer package substrate 602 (FIG. 6), dielectric portions of multilayer package substrate 802 are omitted for clarity of the figure. First conductor layer 804 is the device-side layer of multilayer package substrate 802. First conductor layer 804 includes connection points 814 where conductive connection posts are to be in contact with first conductor layer 804. Only a few of connection points 814 are labeled for clarity of the drawing, but each of the dots in FIG. 8 is one of connection points 814. In this example, only connection points with high current density issues are adjusted. Second conductor layer 806, third conductor layer 808 and fourth conductor layer 810 are also shown in FIG. 8.

Figure 9:
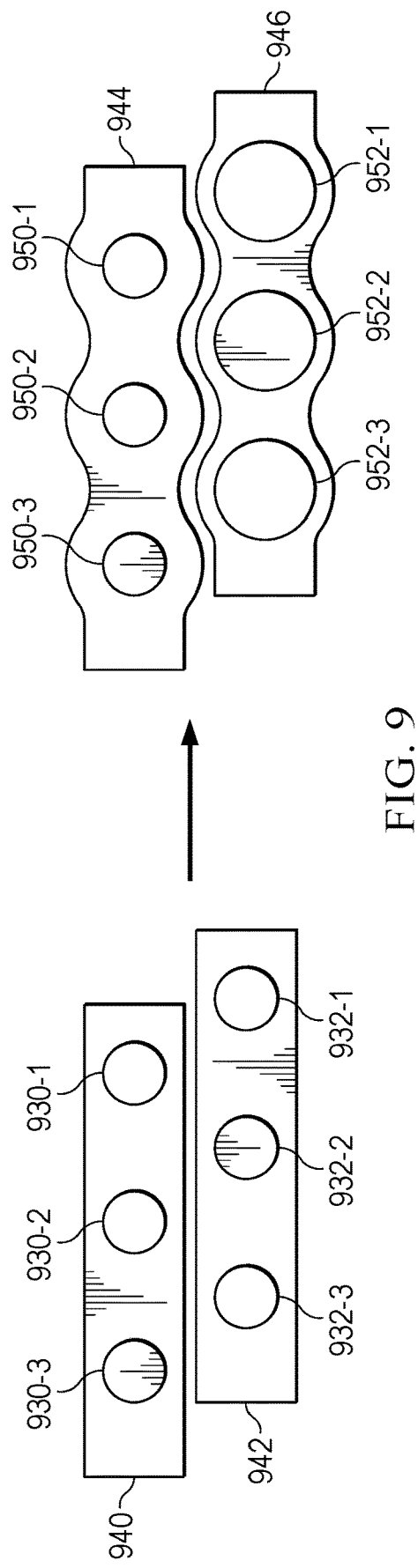
FIG. 9 is a plan view of adjustment of a pair of leads.

FIG. 9 is a plan view of adjustment of another pair of leads 940 and 942. Leads 940 and 942 are two conductors that are adjacent to each other. Lead 940 includes attachment points 930-1, 930-2, and 930-3. Lead 942 includes attachment points 932-1, 932-2, and 932-3. Analyzing leads 940 and 942 as discussed above with regard to FIG. 7B and adjusting as discussed above with regard to FIG. 7C, lead 940 is adjusted as shown with adjusted lead 944 and lead 942 is adjusted as shown with adjusted lead 946 thus providing two adjusted conductors. In addition, the current density in the conductive connection posts attached to attachment points 952-1, 952-2, and 952-3 indicates that the current density in these conductive connection posts is high. Thus, the attachment points 952-1, 952-2, and 952-3 are larger than attachment points 932-1, 932-2, and 932-3, with their associated conductive connection posts also having a concomitantly larger diameter. On the other hand, analysis of the conductive connection posts attached at attachment points 930-1, 930-2, and 930-3 indicates that the current density in these conductive connection posts is average or below average. Therefore, attachment points 950-1, 950-2, and 950-3, and thus their associated conductive connection posts, are the same size as attachment points 930-1.930-2, and 930-3. Both lead 940 and lead 942 are expanded in high current density points and narrowed at low current density points as shown in adjusted lead 944 and adjusted lead 946, respectively. In addition, the position of adjusted leads 944 and 946 is adjusted so that a minimum separation between adjusted leads 944 and 946 is maintained in accordance with the design rules for the device including adjusted leads 944 and 946.

FIGS. 10A and 10B (collectively "FIG. 10") are cross-sectional views of lead 942 and adjusted lead 946 (FIG. 9), respectively showing a current density analysis. FIG. 10A is a cross-sectional diagram of lead 942 with current density shading as determined by computer modeling the conductive connection posts 1032-1 through 1032-3. Conductive connection posts 1032-1 through 1032-3 show that these conductive connection posts carry a high current density. That is, the current density in conductive post connects is greater than a selected threshold that is selected to keep the current generated heat below a selected threshold to avoid heat stress in the device. On the other hand, lead 1042 has only a few high current density spots. The lead in layer 1006, which carries the current to the lead in layer 1008, only has a few hot spots. The lead in layer 1008 shows a high incoming current density. However, the lead in layer 1008 is not in contact with connections or joints that are sensitive to heat. Thus, no adjustment to the lead in layer 1008 is performed in this example. However, excess heat in other leads, such as those in layer 1008, may cause failures do to dielectric breakdown or metal migration. Therefore, the techniques described herein may be applied to any layer or lead in the package substrate. Because the conductive connection posts 1032-1 through 1032-3 in FIG. 10A show a high current density, in the adjusted configuration of FIG. 10B, the size of conductive connection posts 1052-1 through 1052-3 is enlarged. This lowers the current density in adjusted conductive connection posts 1052-1 through 1052-3 and thus improves longevity and performance of the integrated circuit package by avoiding heat stress. Because the hot spots in adjusted lead 1046 (which corresponds to adjusted lead 946 (FIG. 9)) are where conductive connection posts 1052-1 through 1052-3 contact lead 1046, lead 1046 is only expanded to accommodate design rules for the margins around conductive connection posts 1052-1 through 1052-3.

Figure 11:
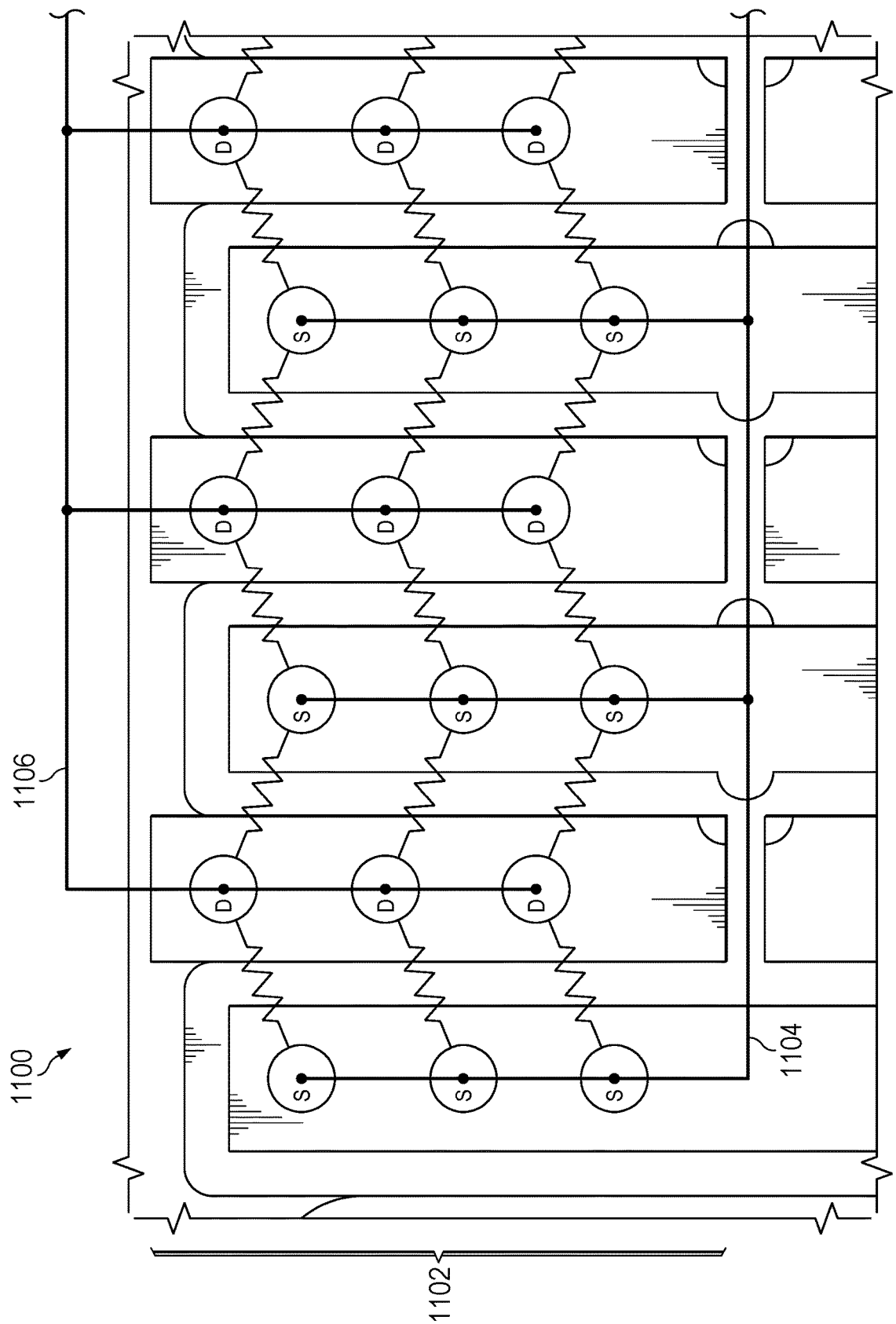
FIG. 11 is a conceptual diagram illustrating computer modeling of current density in multilayer package substrate.

FIG. 11 is a conceptual diagram 1100 illustrating computer modeling of current density in multilayer package substrate. Lead 1106 is a conceptual power input that feeds a resistance mesh 1102. Lead 1104 provides the opposing power input lead. Resistance mesh 1102 is shown as coupling adjacent conductive connection posts. This simple configuration provides good data on the performance of the multilayer package substrate. However, it is not complete data. For clarity of the figure, resistance mesh 1102 only shows simple connections between conductive connection posts. For a better analysis, each lead on conductive connection post is broken down into small portions of material. For example, a cube having sides 0.01 µm. The resistance of these small portions is modeled and a connection to each adjacent small portion is included in the model. A representative input signal is mathematically applied to leads 1104 and 1106. The effect of the signal on each of the small portions is calculated and the current density is calculated from the current in each of the small portions. This allows for a determination of the current density in the portions of the leads and the conductive connection posts.

Figure 12A:
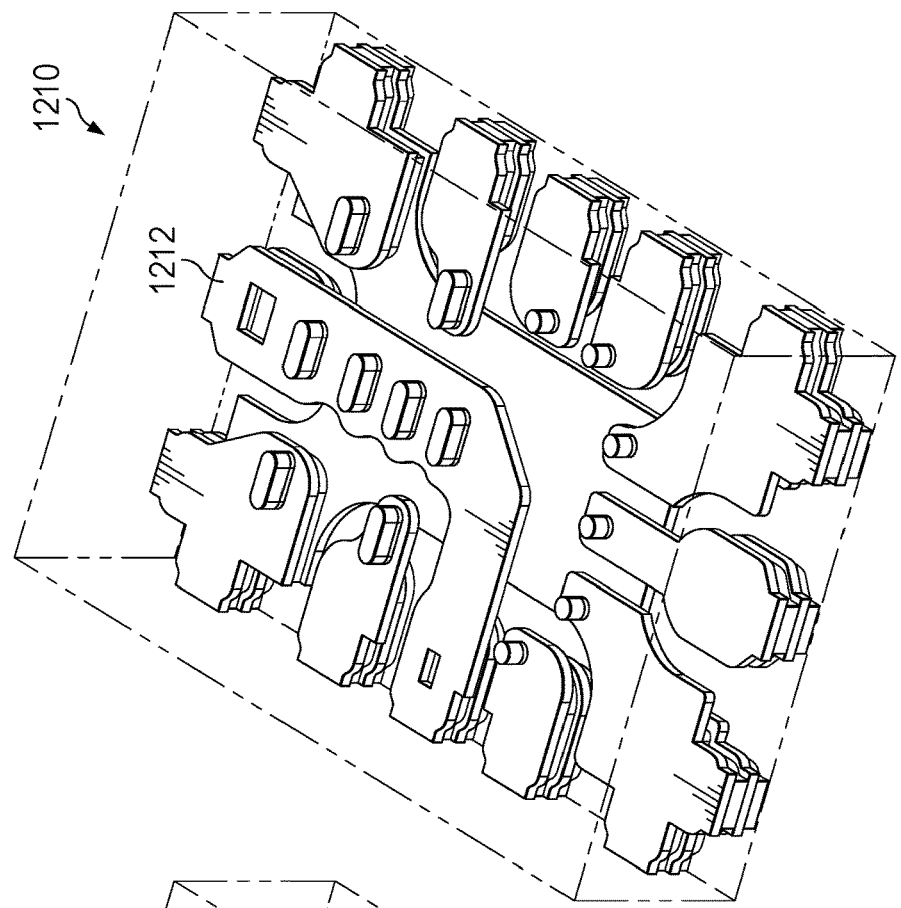
FIGS. 12A-D (collectively "FIG. 12") are perspective diagrams of another example lead.
Figure 12B:
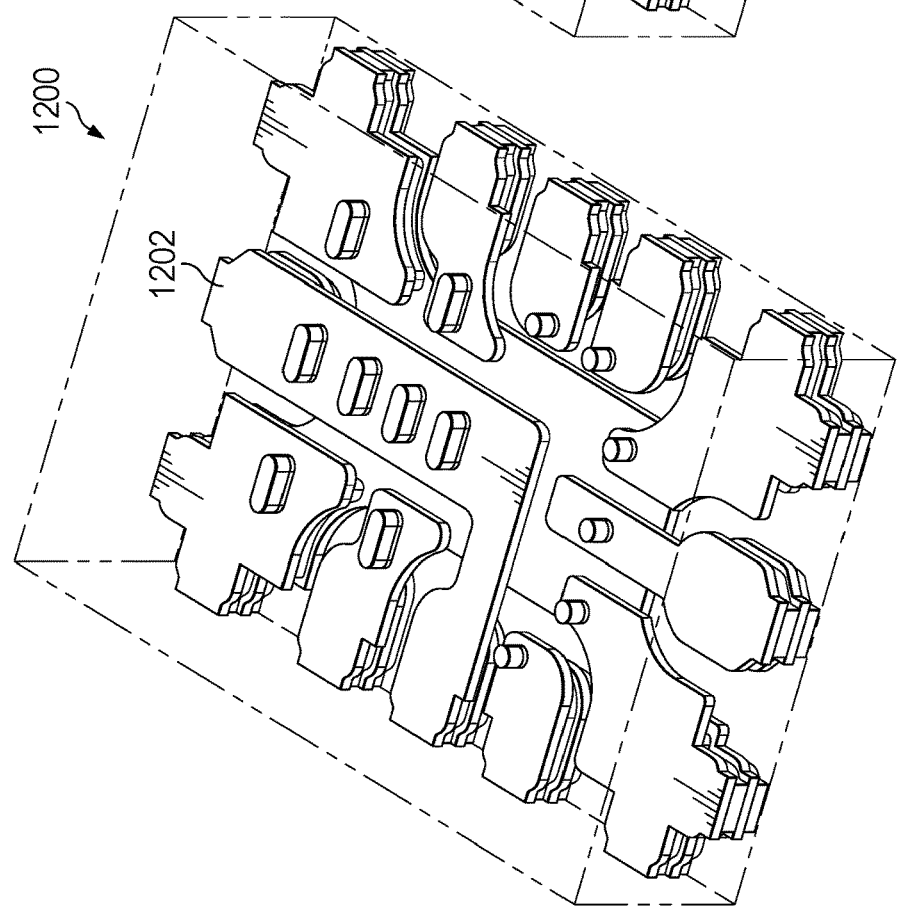
Figure 12C:
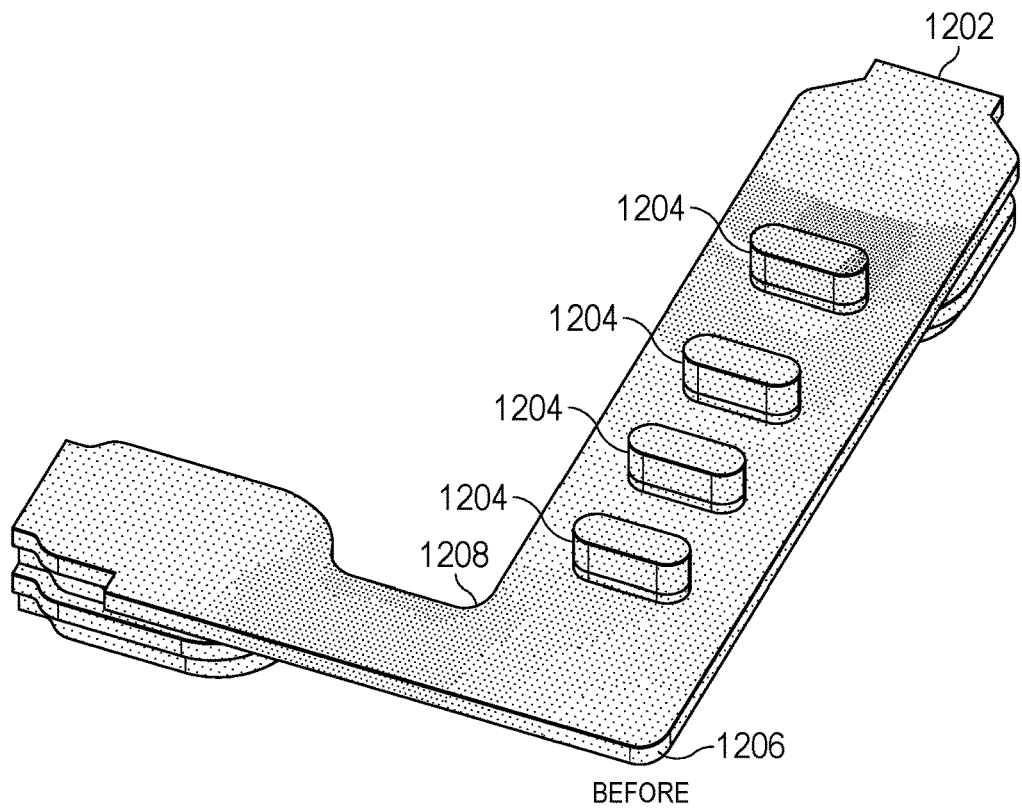
Figure 12D:
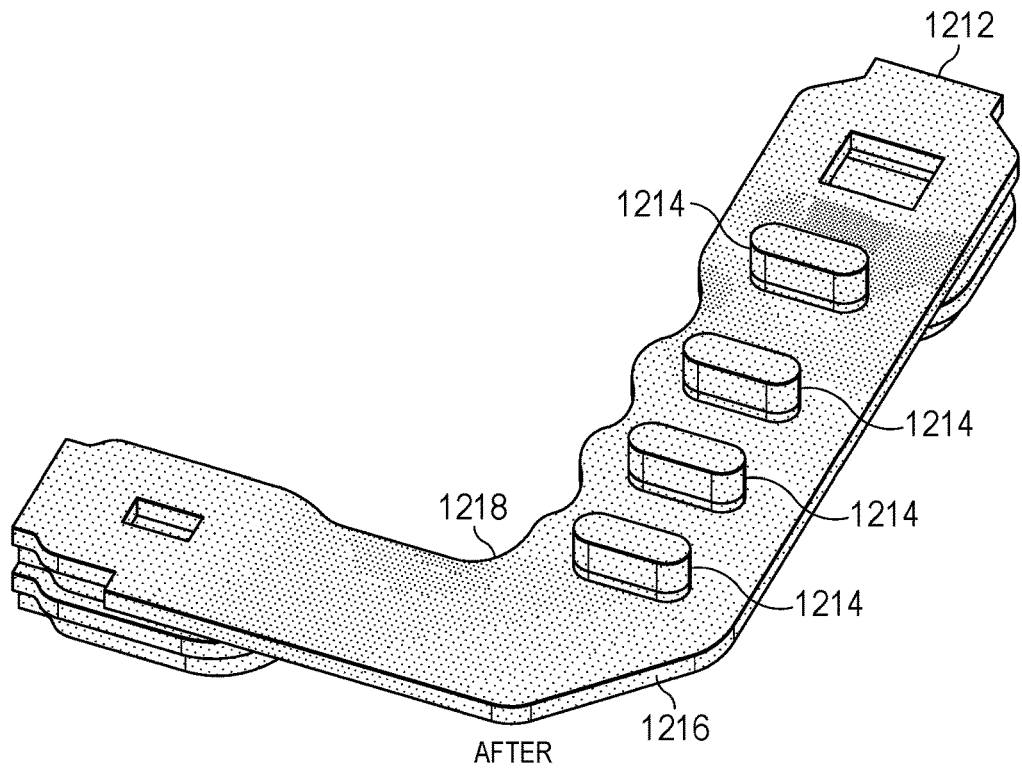

FIGS. 12A-D (collectively "FIG. 12") are perspective diagrams of another example adjustment of a lead 1202. Packaged integrated circuit 1200 includes a lead 1202 that provides power to a portion of an integrated circuit (not shown for clarity). FIG. 12B shows packaged integrated circuit 1210 that includes adjusted lead 1212, which is another example of an adjusted conductor and is an adjusted version of lead 1202. FIG. 12C shows the results of a current density analysis of lead 1202. A greater-than-average current density is around conductive connection posts 1204 and at interior corner 1208. A lower-than-average current density is in corner 1206. FIG. 12D shows adjusted lead 1212, which is lead 1202 after modification. Additional metal is provided on the interior portions of adjusted lead 1212 by conductive connection posts 1214 and at interior corner 1218. Metal is taken away from corner 1216 and the areas between conductive connection posts 1214. The result is that adjusted lead 1212 uses about the same amount of metal but provides more even current density, which provides additional resistance to heat related failures for packaged integrated circuit 1210 as opposed to package of integrated circuit 1200.

Figure 13:
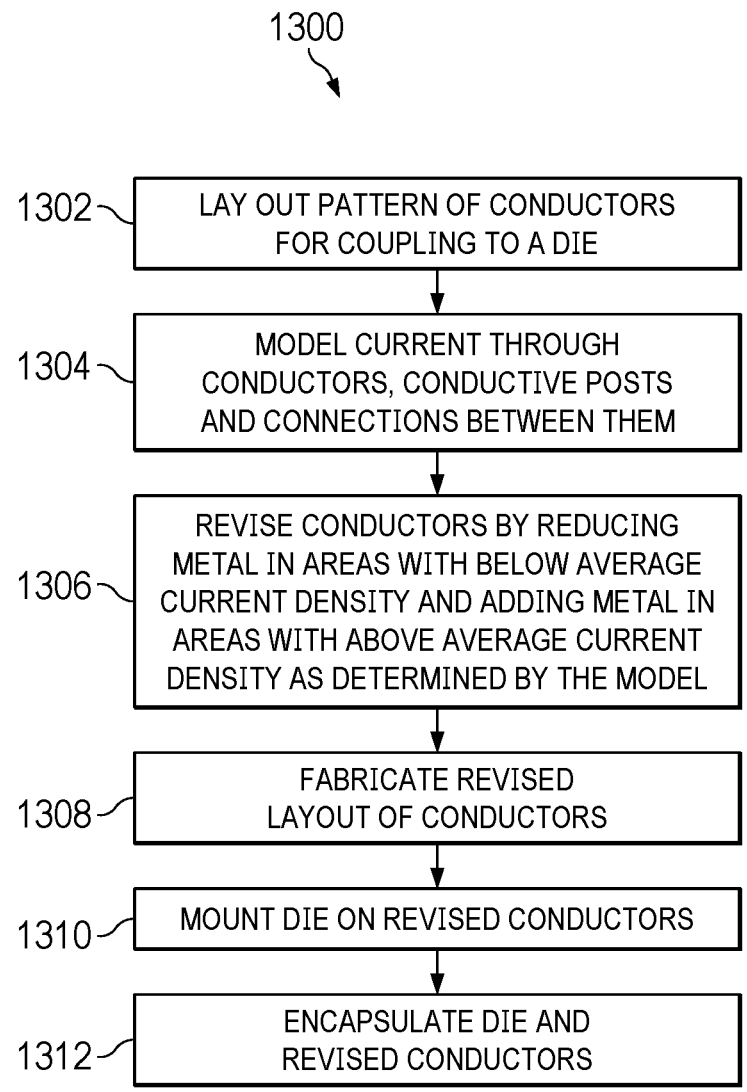
FIG. 13 is a process flow diagram of an example process.

FIG. 13 is a process flow diagram of an example process 1300. Step 1302 is laying out a pattern of conductors for coupling to a die. Example conductors are included in first conductor layer 604 (FIG. 6). Step 1304 is, using the layout of step 1302, modeling the current through the conductors, conductive connection posts and the connections between them. An example of this step is explained with regard to FIG. 11. Step 1306 is revising the layout of step 1302 by reducing metal in areas with below average current density and adding metal in areas with above average current density to provide an adjusted lead. Stated differently, revising includes marking the conductors to be formed as adjusted leads by adding or reducing metal in areas below or above a threshold of current density respectively. The size of conductive connection posts also can be adjusted similarly by marking them prior to adjusting according to the examples in the disclosure. An example of this is first conductor layer 804 in FIG. 8 that includes adjusted leads 822, 824, and 826. As an optional part of this step, the size of conductive connection posts can be made larger (increased circumference) for current densities greater than average or smaller (decreased circumference) for current densities below average. In addition, step 1306 optionally includes adjusting the relative position of conductors to maintain adequate spacing between conductors. Step 1308 is fabricating conductors based on the adjusted layout of step 1306. Step 1310 is mounting a die onto the adjusted conductors. Step 1312 is encapsulating the conductors and the mounted die.

The use of the arrangements provides a microelectronic device package with an integrated antenna and a semiconductor die. Existing materials and assembly tools are used to form the arrangements, and the arrangements are low in cost when compared to solutions using additional circuit boards. The arrangements are formed using existing methods, materials and tooling for making the devices and are cost effective.

Modifications are possible in the described examples, and other examples are possible, within the scope of the claims.

What is claimed is:
1. A method comprising:
    laying out at least two conductors;
    modeling a conductor current through the at least two conductors to determine a current density in the at least two conductors;
    marking the at least two conductors to form adjusted conductors by adding conductive material to areas of the conductor where the conductor current shows the current density is above a threshold;
    fabricating the adjusted conductors;
    mounting a die to the adjusted conductors; and
    encapsulating the die and the adjusted conductors in an encapsulant.
2. The method of claim 1 further comprising:
    laying out at least one conductive connection post between one of the at least two conductors and the die;

modeling a conductive connection post current through the at least one conductive connection post;

adjusting a size of the at least one conductive connection post as an adjusted conductive connection post if the conductive connection post current in the at least one conductive connection post is greater than a selected threshold;

fabricating the adjusted conductive connection post on the die; and wherein the adjusted conductive connection post contacts the adjusted conductors during the mounting of the die.

3. The method of claim 2, further comprising depositing a conductive material onto a bond pad to form the adjusted conductive connection post.

4. The method of claim 2, wherein the adjusted conductive connection post includes a solder bump at an end of the adjusted conductive connection post distal from the die.

5. The method of claim 1, further comprising adjusting positioning of the adjusted conductors relative to each other to provide a minimum separation between the adjusted conductors.

6. The method of claim 1, wherein the adjusted conductors are in a layer of a multilayer package substrate.

7. The method of claim 1, wherein the encapsulant is a mold compound.

8. A method comprising:

laying out at least two conductors;

laying out at least one conductive connection post between one of the at least two conductors and a die;

modeling a conductor current through the at least two conductors and the at least one conductive connection post to determine a current density in the at least two conductors and the at least one conductive connection post;

marking the at least two conductors as to form adjusted conductors to add conductive material to areas of the conductor where the modeling conductor current shows the current density is above a threshold;

marking the at least one conductive connection post to be adjusted in size and to form as an adjusted conductive connection post if the current density in the at least one conductive connection post is greater than a selected threshold;

fabricating the adjusted conductive connection post on the die;

fabricating the adjusted conductors; and mounting a die to the adjusted conductors using the adjusted conductive connection post; and covering the die, the adjusted conductive connection post, and the adjusted conductors with an encapsulant.

9. The method of claim 8, further comprising depositing a conductive material onto a bond pad to form the adjusted conductive connection post.

10. The method of claim 8, wherein the adjusted conductive connection post includes a solder bump at an end of the adjusted conductive connection post distal from the die.

11. The method of claim 8, further comprising adjusting positioning of the adjusted conductors relative to each other to provide a minimum separation between the adjusted conductors.

12. The method of claim 8, wherein the adjusted conductors are in a layer of a multilayer package substrate.

13. The method of claim 8, wherein the encapsulant is a mold compound.

\* \* \* \* \*